United States Patent [19]

Bogin et al.

[11] Patent Number: 5,835,435
[45] Date of Patent: Nov. 10, 1998

[54] METHOD AND APPARATUS FOR DYNAMICALLY PLACING PORTIONS OF A MEMORY IN A REDUCED POWER CONSUMTION STATE

[75] Inventors: Zohar Bogin; David E. Freker, both of Folsom, Calif.

[73] Assignee: Intel Corporation, Santa Clara, Calif.

[21] Appl. No.: 982,876

[22] Filed: Dec. 2, 1997

[51] Int. Cl.[6] .................................................. G11C 8/00
[52] U.S. Cl. ........................................................ 365/227
[58] Field of Search ................................. 365/226, 227, 365/230.3

[56] References Cited

U.S. PATENT DOCUMENTS

| | | | |
|---|---|---|---|
| 5,734,913 | 3/1998 | Iwamura et al. | 365/227 |
| 5,737,746 | 4/1998 | Hardin et al. | 365/227 |

OTHER PUBLICATIONS

"Synchronous DRAM", 1997 Micron Technology, Inc., pp. i–viii, & 1–1 through 1–43.

"New DRAM Technologies", Steven A. Przybylski, 1996, pp. i–v, ix–xiii, xv–xx, 171–183, 204–242, 259–300.

Primary Examiner—David Nelms
Assistant Examiner—Trong Phan
Attorney, Agent, or Firm—Blakely, Sokoloff, Taylor & Zafman

[57] ABSTRACT

An apparatus and method for dynamically placing portions of a memory in a reduced power consumption state. Requests to access a memory that includes a plurality of rows of memory components are received. One or more of the plurality of rows of memory components are placed in a reduced power consumption state based on the requests while one or more other rows of the plurality of rows are accessed.

22 Claims, 7 Drawing Sheets

METHOD AND APPARATUS FOR DYNAMICALLY PLACING PORTIONS OF A MEMORY IN A REDUCED POWER CONSUMTION STATE

FIELD OF THE INVENTION

The present invention relates to the field of memory management, and more particularly to managing power consumption in a memory subsystem.

BACKGROUND OF THE INVENTION

Synchronous dynamic random access memory (SDRAM) components are used in the system memory of many modern computer systems, particularly desktop machines. In the SDRAM design, a starting address received from a memory controller is stored in an address register within the SDRAM. After the SDRAM is read or written at the starting address, the starting address is automatically incremented in response to a DRAM clock signal to address successive memory locations. Because successive addresses are generated within the DRAM component rather than being received over a relatively high capacitance address bus, each incremental address becomes valid more quickly than it could otherwise be received from the memory controller. Consequently, data can be read from or written to sequential addresses in SDRAM significantly faster than in other types of memory. Because data flow in modern computer systems often involves transferring blocks of data to or from sequential addresses in system memory (e.g., to fill cache lines, transfer streams of video data, etc.), the fast access to sequential SDRAM locations usually translates into a faster overall access rate for SDRAM than for other types of memory.

Despite the performance advantages of SDRAM, extended-data-out (EDO) DRAM remains prevalent in mobile devices, such as notebook and laptop computers. The primary reason for this is that SDRAM typically consumes more power than EDO DRAM, a precious commodity in battery-operated machines. For example, when in an idle state (i.e., no access initiated or in progress), SDRAM components may consume as much as fifty times more power than idle EDO DRAM components.

One technique for reducing the power consumed by SDRAM-based system memory is to place the system memory in a power-down mode by deasserting a clock enable signal that is supplied to each SDRAM component in the system memory. When the clock enable signal is deasserted, logic elements within the individual DRAM components no longer change state in response to the DRAM clock signal. Because the greatest power draw occurs as the DRAM logic elements transition between states, deasserting the clock enable signal dramatically reduces the power consumed by idle SDRAM components, making them comparable, at least from a power consumption standpoint, to idle EDO DRAM components.

One disadvantage of powering down the system memory is that it must be re-powered each time access to system memory is required. This presents at least two problems. First, SDRAM cannot be instantly transitioned between power down and powered states so that a timing penalty is incurred for each re-powering of the system memory. While this timing penalty is usually short (one or two DRAM clock cycles, for example), it can become significant when the system memory is frequently switched between the power-down and powered states. A second and related problem is that at least some portion of system memory is typically in use whenever a computer-user is actively using the computer system. Thus, when power saving is most critical, i.e., when the computer system is turned on and being used by the computer-user, it is often impractical to power the system memory down. What is needed is a way to reduce system memory power consumption without having to power the entire system memory down.

SUMMARY OF THE INVENTION

An apparatus and method for dynamically placing portions of a memory in a reduced-power consumption state are disclosed. Requests are received to access a memory that includes rows of memory components. Based on the requests, one or more of the rows of memory components are placed in a reduced power consumption state while one or more others of the rows of memory components are accessed.

BRIEF DESCRIPTION OF THE DRAWINGS

The present invention is illustrated by way of example and not limitation in the figures of the accompanying drawings in which like references indicate similar elements and in which.

DETAILED DESCRIPTION

According to at least one embodiment of the present invention, a separate clock enable signal is provided to each of a plurality of rows of SDRAM components in a system memory so that the rows may be powered or powered down independently of one another. State management logic is used to track the respective states of banks of memory within each of the rows based on access requests issued by one or more requesting agents. Power down logic samples the states of the banks of memory maintained by the state management logic and deasserts the clock enable signal for each row in which all banks of memory are idle. By selectively powering down one or more rows of SDRAM memory components in this manner, the amount of power consumed by an SDRAM-based system memory can be significantly reduced. More generally, embodiments of the present invention may be used to reduce power consumption in any memory that is organized into physical or logical units that may independently be placed in a reduced power state.

Figure 1:
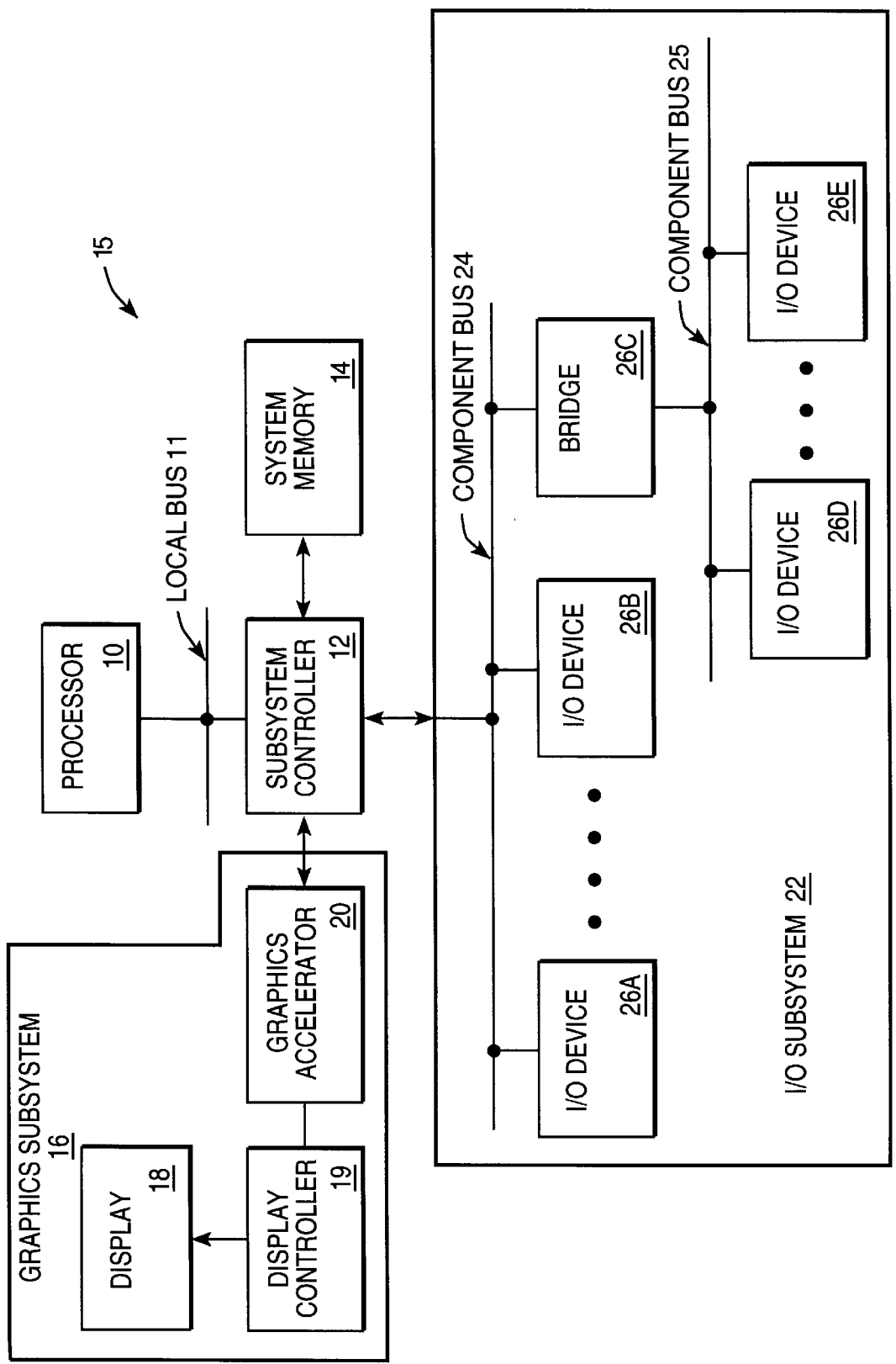
FIG. 1 is a block diagram of an apparatus in which one or more embodiments of the present invention may be used.

FIG. 1 is a block diagram of an apparatus 15 in which one or more embodiments of the present invention may be used. The apparatus 15 includes a processor 10, a memory subsystem 14, a graphics subsystem 16 and an I/O subsystem 22, all coupled to a subsystem controller 12. The processor 10 is coupled to the subsystem controller 12 via a local bus 11, and the graphics subsystem 16, memory subsystem 14 and I/O subsystem 22 are likewise coupled to the subsystem controller via respective buses.

According to one embodiment, the memory subsystem 14 is made up of multiple rows of SDRAM components. These rows are referred to herein as "component rows" to avoid confusion with rows of memory cells within the SDRAM components. Although the memory subsystem 14 is described herein as being implemented by SDRAM components, other types of memory components that are capable of being switched into and out of a reduced power-consumption state may be used without departing from the spirit and scope of the present invention.

The I/O subsystem 22 is made up of one or more component buses (24, 25) to which various I/O devices (26A, 26B, 26D, 26E) are coupled. A variety of different buses may be used in the I/O subsystem 22, including a Peripheral Component Interconnect (PCI) bus (e.g., a bus that complies with PCI Specification Rev. 1.0, published Jun. 22, 1992 by Intel Corporation, or later revisions of the PCI Specification), an Industry Standard Architecture (ISA) bus, an Extended ISA bus (EISA), a Micro Channel bus and so forth. If more than one component bus is present in the I/O bus subsystem 22 (e.g., one or more PCI buses for high bandwidth data transfer and one or more ISA buses to support old-style expansion cards), the buses may be interconnected through a bridge 26C or similar bus-to-bus connection device.

The nature of the I/O devices is determined by the intended purpose of the apparatus 15. For example, if the apparatus 15 is a computer system, the I/O devices (26A, 26B, 26D, 26E) would typically include user-input devices such as a keyboard and cursor control device (e.g., a mouse, trackball or stylus), one or more mass storage devices such as devices for reading and writing data on optical and magnetic storage media, and various other computer system devices (e.g., printer, audio I/O, serial bus control devices, and so forth). Alternatively, if the apparatus 15 is a digital camera, cell telephone or other consumer electronics device, the I/O devices (26A, 26B, 26D, 26E) might include user interfaces (e.g., buttons and display) to allow the device to be configured for operation and other function-specific devices (e.g., radio-frequency transceiver for cell telephone, aperture and focus control for a digital camera, etc.).

The graphics subsystem 16 includes a graphics accelerator 20 coupled to the subsystem controller 12 to allow high speed transfer of graphics data from the memory subsystem 14 to the graphics subsystem 16 where the graphics data is processed and presented on a display 18 by a display controller 19. In one embodiment, the graphics accelerator 20 is coupled to the subsystem controller via an Accelerated Graphics Port (AGP) that complies with the "Accelerated Graphics Port Interface Specification" Revision 1.0 or later, published Aug. 1, 1996 by the Intel Corporation of Santa Clara, Calif. The AGP is a dedicated interface for transferring graphics information and commands between the graphics accelerator 20 and the subsystem controller. In alternate embodiments, other dedicated graphics ports may be used. Also, instead of being coupled to the subsystem controller via a dedicated graphics port, the graphics subsystem 16 may alternatively be coupled to the subsystem controller 12 via a shared bus, such as the local bus 11 or a component bus (24, 25) in the I/O subsystem 22.

Figure 2:
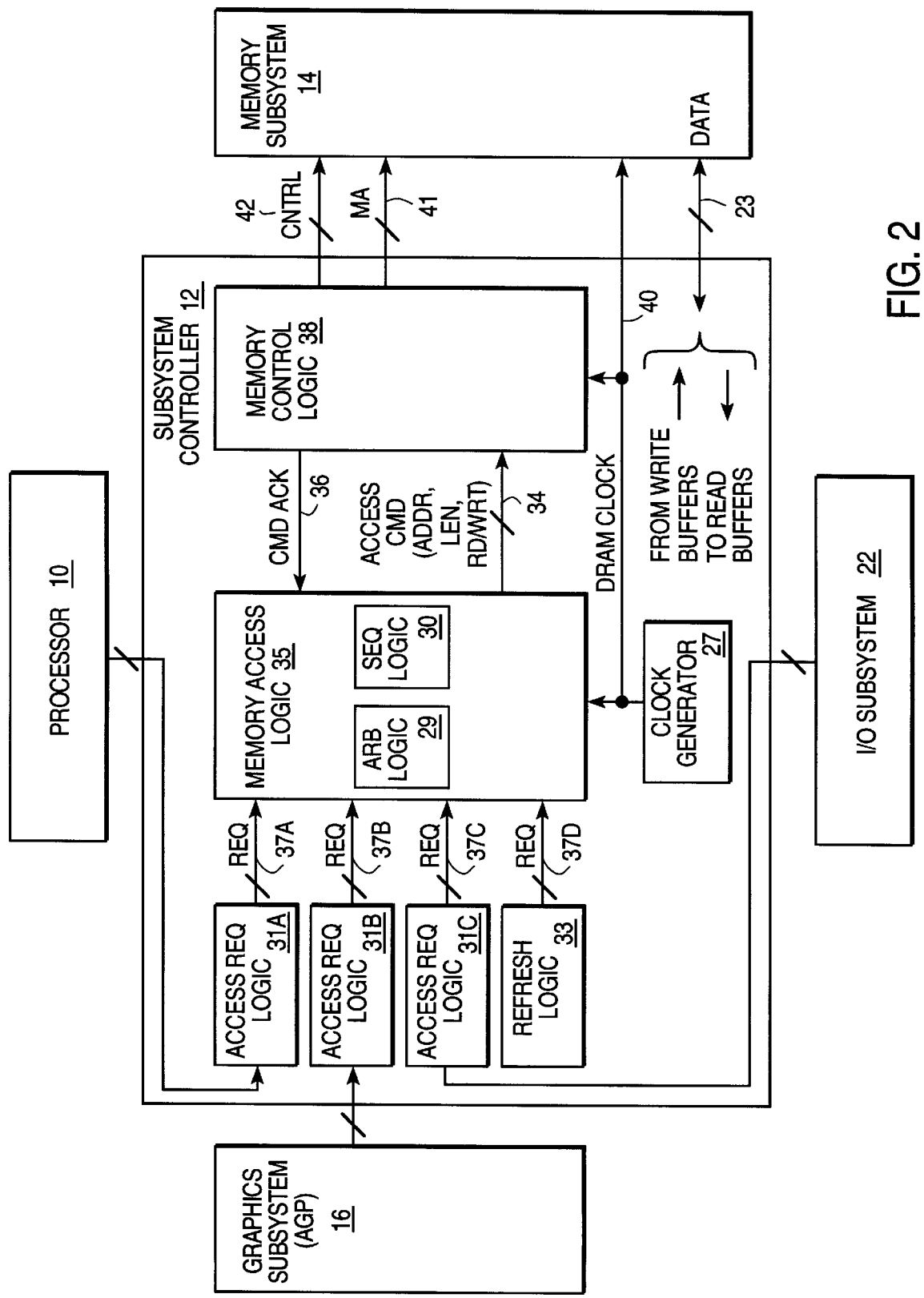
FIG. 2 depicts an embodiment of a subsystem controller.

FIG. 2 is a block diagram of one embodiment of the subsystem controller 12. The subsystem controller 12 includes access request logic (31A, 31B, 31C), memory access logic 35 and memory control logic 38. The subsystem controller 12 may also include refresh logic 33 to control the refresh of DRAM cells in the memory subsystem 14. In alternative embodiments, the refresh logic 46 may be separate from the subsystem controller 12. Although the focus of the following discussion is the functioning of the subsystem controller 12 as a memory controller, the subsystem controller 12 may also include logic to support other functions, including logic to manage requests, for example, to transfer data between the processor 10 and the I/O subsystem 22, between the processor 10 and the graphics subsystem 16, or between the graphics subsystem 16 and the I/O subsystem 22.

In one embodiment, the access request logic (31A, 31B, 31C) is used to manage memory access requests received from the processor 10, the graphics subsystem 16, and one or more bus master devices in the I/O subsystem 22. In alternative embodiments there may be more or fewer requesting agents than shown in FIG. 2. Also, instead of providing separate access request logic units (45A, 45B, 45C) for the various requesting agents, a single access request logic unit could be used to service multiple requesting agents in an alternative embodiment.

In one embodiment, the access request logic (31A, 31B, 31C) prioritizes memory access requests according to various criteria (e.g., page hit optimization, data dependency rules, etc.) and then forwards the requests to the memory access logic 35. This is shown generally in FIG. 2 by the request paths (37A, 37B, 37C, 37D) from the access request logic (31A, 31B, 31C) and from the refresh logic 33. The "/" symbol across the request paths and other signal transfer paths shown in the various figures indicates that the signal path may include multiple conductors. However, the absence of a "/" symbol on a signal path should not be construed to limit embodiments of the present invention to a single signal conductor for that path. Also, each of the request paths may include parallel paths for concurrently asserting read and write requests to the memory access logic 35.

The memory access logic 35 includes arbitration logic 29 to serialize the various memory access requests asserted by the various requesting agents. According to one embodiment, the arbitration logic 29 gives access priority to certain requests from the processor 10 and from the graphics subsystem 16, but otherwise services requests in a manner that ensures memory access to all requesting agents.

As each request is selected to be serviced (i.e., as requests are serialized), the request is forwarded to sequencing logic 30 within the memory access logic 35. The sequencing logic 30 issues various control signals in response to access request, including an access command 34 to the memory control logic that includes an address and other parameters indicated by the access request. In response to the access command 34, the memory control logic 38 asserts control signals 42 and address signals 41 to access the memory subsystem 14. The memory control logic 38 outputs a command acknowledge signal 36 in response to each access command 34 to inform the memory access logic 35 that it may issue a new access command 34.

In one embodiment, the subsystem controller 12 includes a clock generator 27 that outputs a DRAM clock signal 40 to at least the memory access logic 35, the memory control logic 38 and the memory subsystem 14. In alternate embodiments, the DRAM clock signal 40 may be generated by other logic within the subsystem controller 12 or by logic that is external to the subsystem controller 12. As indicated in FIG. 2, data is transferred between the memory subsystem 14 and various read and write buffers in the subsystem controller via data path 23.

Figure 3:
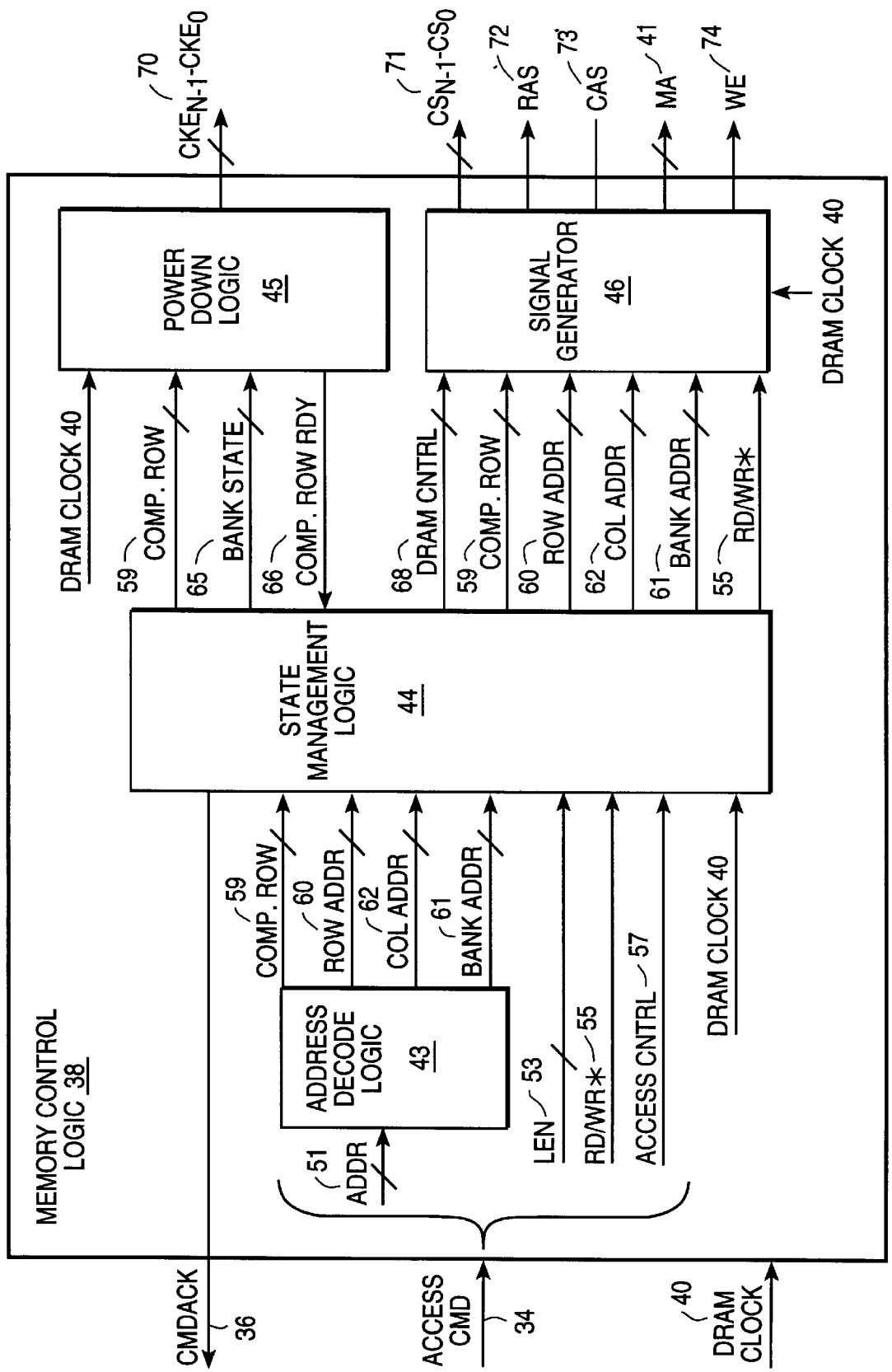
FIG. 3 depicts an embodiment of memory control logic.

FIG. 3 is a block diagram of the memory control logic 38 according to one embodiment. The memory control logic 38 includes address decode logic 43, state management logic 44, a signal generator 46 and power down logic 45. In one embodiment, the memory control logic receives access commands 34 from the memory access logic and the DRAM clock signal 40. In alternate embodiments, the memory control logic may receive other input signals.

In one embodiment, each access command received from the memory access logic (e.g., element 35 of FIG. 2) includes at least four components: an address 51, a transaction length 53, a read/write indicator 55 and an access control signal 57 that is used to delineate each new access command from the previous access command. Access commands 34 may include more or fewer components in alternate embodiments.

As shown in FIG. 3, the address 51 is input to the address decode logic 43. In one embodiment, the address decode logic 43 decodes the address 51 into four partial address values: a component row selector 59, a row address 60, a column address 62, and a bank address 61. The state management logic 44 receives the partial address values from the address decode logic 43 and also receives the transaction length 53, read/write indicator 55 and access control signal 57 from the access command 34. As discussed below, the state management logic 44 uses these inputs to generate state information representative of the respective states of banks of memory within the memory subsystem. In one embodiment, this state information is output to the power down logic 45 (e.g., via the bank state path 65) along with the component row selector 59 to allow the power down logic 45 to determine, for each row of SDRAM components in the memory subsystem, whether to assert or deassert a respective one of a plurality of clock enable signals 70 (i.e., $CKE_{N-1}$–$CKE_0$). As discussed below, a row of SDRAM components is said to be powered when its clock enable signal is asserted, and powered down when its clock enable signal is deasserted. In one embodiment, the power down logic 45 outputs a component row ready signal 66 to indicate whether the row of SDRAM components specified by the component row selector is in a powered or powered down state. This signal is used by the state management logic 44 to control the timing of the commanded memory access and assertion of the corresponding command acknowledge signal 36.

In one embodiment, the state management logic 44 outputs the partial address signals (i.e., component row selector 59, row address 60, column address 62, bank address 61) and the read/write indicator 55 to the signal generator 46. The state management logic 44 also outputs a DRAM control signal 68 to the signal generator 46 to indicate the state of the bank of memory to be accessed. The signal generator 46 uses the partial address information to control the state of the chip select signals 71 ($CS_{N-1}$–$CS_0$), multiplexed address signals 41 (MA) and write enable signal 74 during a given cycle of the DRAM clock signal 40. The DRAM control signal 68 is used to control the state of the row address strobe (RAS) signal 72 and the column address strobe (CAS) signal 73 asserted during a given cycle of the DRAM clock signal 40.

As discussed below, each SDRAM component typically includes a plurality of memory banks, each of which may be in a different operating state during a given DRAM clock cycle. The chip select 71, row address strobe 72 column address strobe 73 and write enable signal 74 signals are used in various combinations to generate commands to a selected SDRAM component row. The multiplexed address signal (MA) is used to supply the row address and bank address to a selected row of SDRAM components during a first address transfer, and the column address during a subsequent address transfer (hence the name, multiplexed address).

Figure 4:
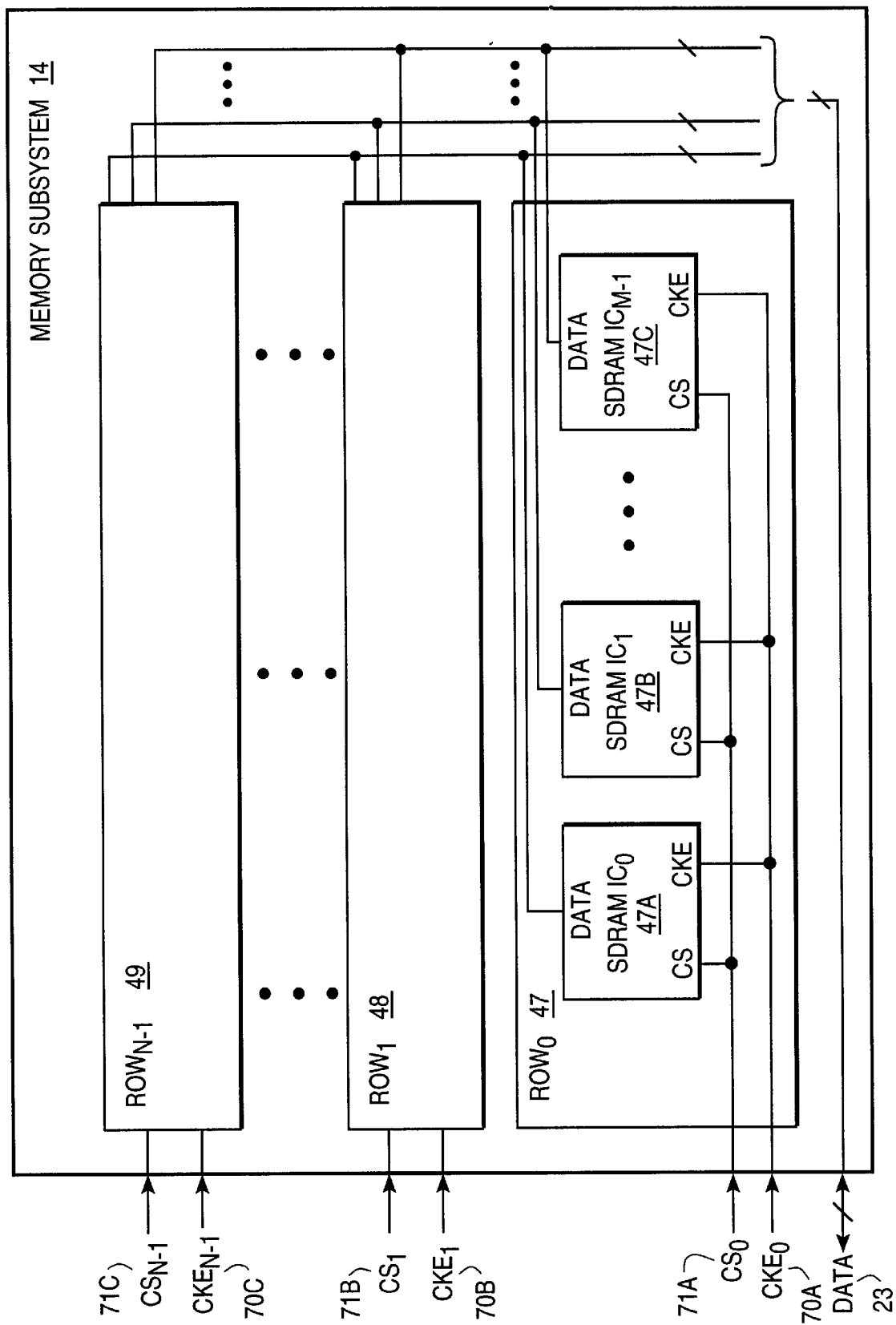
FIG. 4 depicts a memory subsystem that can be controlled using one or more embodiments of the present invention.

FIG. 4 illustrates a memory subsystem 14 according to an embodiment that includes a plurality (N) of rows (47, 48, 49) of SDRAM components. Each component row (47, 48, 49) includes a plurality (M) of SDRAM integrated circuit components (47A, 47B, 47C), with each SDRAM component in the row being coupled to shared chip select line. Because of this arrangement, the SDRAM components that make up a component row are read from or written to as a unit. As shown in component row zero 47, for example, the data terminals of each of the SDRAM components (47A, 47B, 47C) are coupled to a respective portion of the overall data path 23. Thus, when row zero 47 is selected to output or receive data from the data path 23, all of the components in the row 47 are read or written in the same access cycle.

In one embodiment, each SDRAM row (47, 48, 49) is coupled to a separate clock enable line (70A, 70B, 70C) and the clock enable line to a given component row is coupled to the clock enable input of each SDRAM component in the row. Consequently, by selectively asserting or deasserting the clock enable signals $CKE_{N-1}$–$CKE_0$ (70A, 70B, 70C), one or more of the component rows (47, 48, 49) may be powered down while others remain powered. As mentioned above, this arrangement allows substantial power savings in the case where less than all of the rows are actually being accessed to support computer operation and the remainder of the rows are not being used. By dynamically deasserting the clock enable signal to component rows when their constituent banks are idle, and re-powering them only when necessary to support an access (including a refresh operation), the overall power consumed by the system memory can be significantly reduced.

Figure 5:
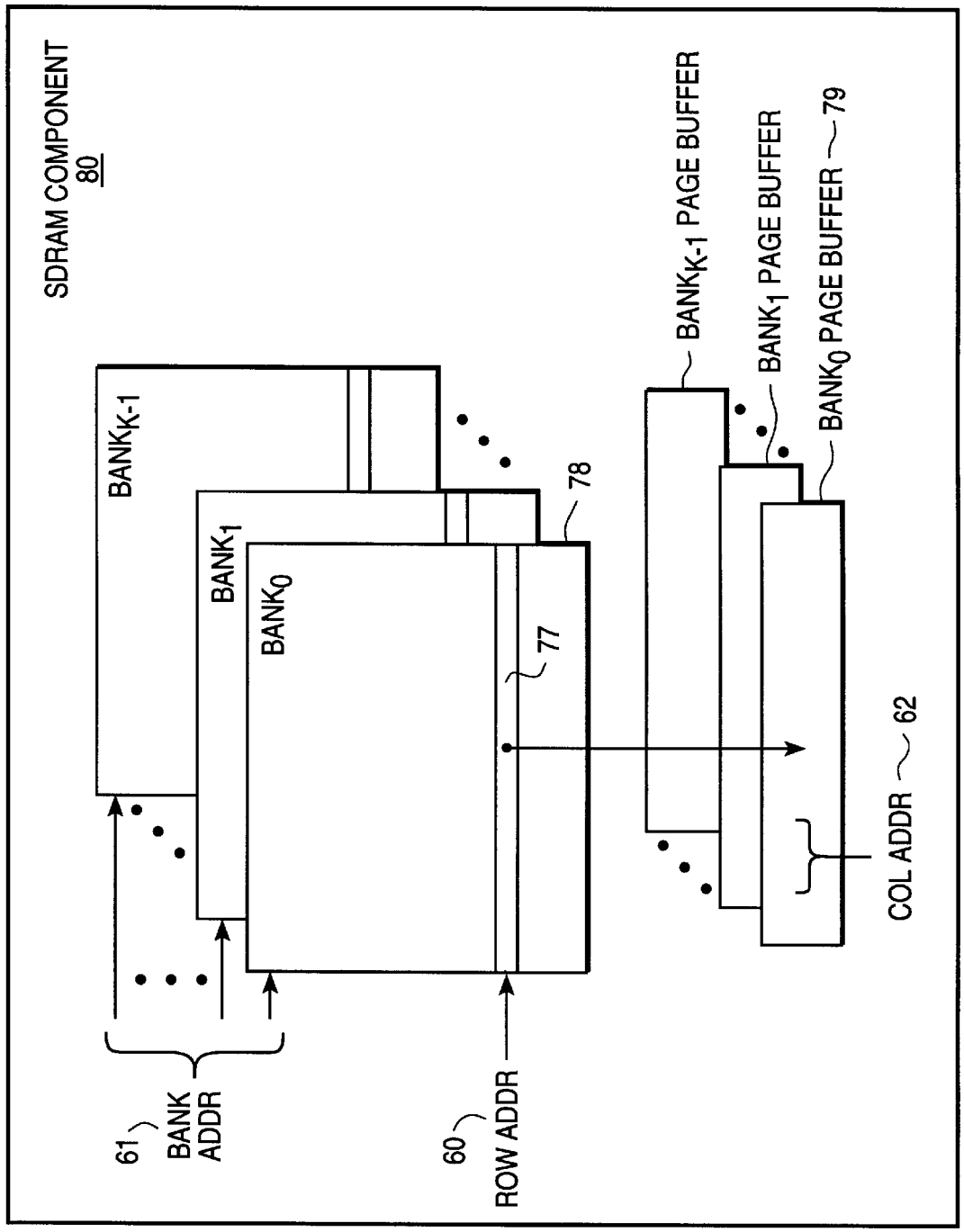
FIG. 5 illustrates the arrangement of memory and page buffers within a typical SDRAM component.

FIG. 5 illustrates the arrangement of memory and page buffers within a typical SDRAM component 80. The SDRAM component 80 is composed of a plurality (K) of banks of memory (i.e., $bank_{K-1}$–$bank_0$), with each bank being made up of multiple rows of DRAM cells (not to be confused with component rows). When a first portion of an address is strobed into the SDRAM, it typically contains the bank address 61 and row address 60 portions of the overall address. The bank address selects one bank 78 of the K banks to be the target of a data write or the source of a data read, and the row address 60 selects a row 77 of DRAM cells from the selected bank 78. A row of DRAM cells that are uniquely identified by the combination of a bank address and a row address is commonly referred to as a "page of memory". The page of memory selected by bank address 61 and row address 60 is amplified by a bank of operational amplifiers 79 so that the data can be output to the data path. This bank of operational amplifiers 79 is often referred to as a page buffer 79 and, as shown in FIG. 5, a separate page buffer is provided for each bank of the SDRAM component 80.

In order to read data from the SDRAM component 80, data from the selected row of DRAM cells must first be transferred to the page buffer 79 for the selected bank 78. This transfer takes a period of time during which the selected bank is said to be in an activate state. After the transfer to the page buffer 79 is complete, the selected bank 78 transitions to an active state and the page of memory (obtained from row 77) is said to be open for read and write operations. Data may be read from or written to a portion of the page buffer 79 indicated by the column address 62, so long as the page remains open. If a predetermined period of time has elapsed without access to an open memory page, or if a command has been received to access another memory page in the selected bank 78, the open page of memory must be closed. This is accomplished by writing the contents of the page buffer 79 back to the selected row of memory cells 77 in an operation called a "precharge". The precharge takes a period of time during which the selected bank 78 is said to be in a precharge state. In the case where a precharge is performed to allow access to another page of memory in the same bank 78, the bank 78 is transitioned from the precharge state to an activate state (to transfer the newly selected row of data into the page buffer 79) and then to an active state, at which point access to the new memory page may begin. If, on the other hand, the precharge is performed due to a timeout (i.e., no access to the open page within a predetermined time), the selected bank 78 is transitioned to an idle state. In the idle state, the bank 78 is available for access, but the page buffer 79 does not necessarily contain a valid page of memory and is said to be closed.

One important characteristic of the SDRAM of FIG. 5 is that each of the K page buffers may be either open or closed independently of one another. Also, each of the K banks of memory may be in either an idle or a non-idle (e.g., activate, active, read, write, precharge) state independently of the other banks. As discussed below, this bank-independence is taken into account when determining whether or not the clock enable signal to a row of SDRAM components may be deasserted to place the component row in a reduced power consumption state.

Figure 6:
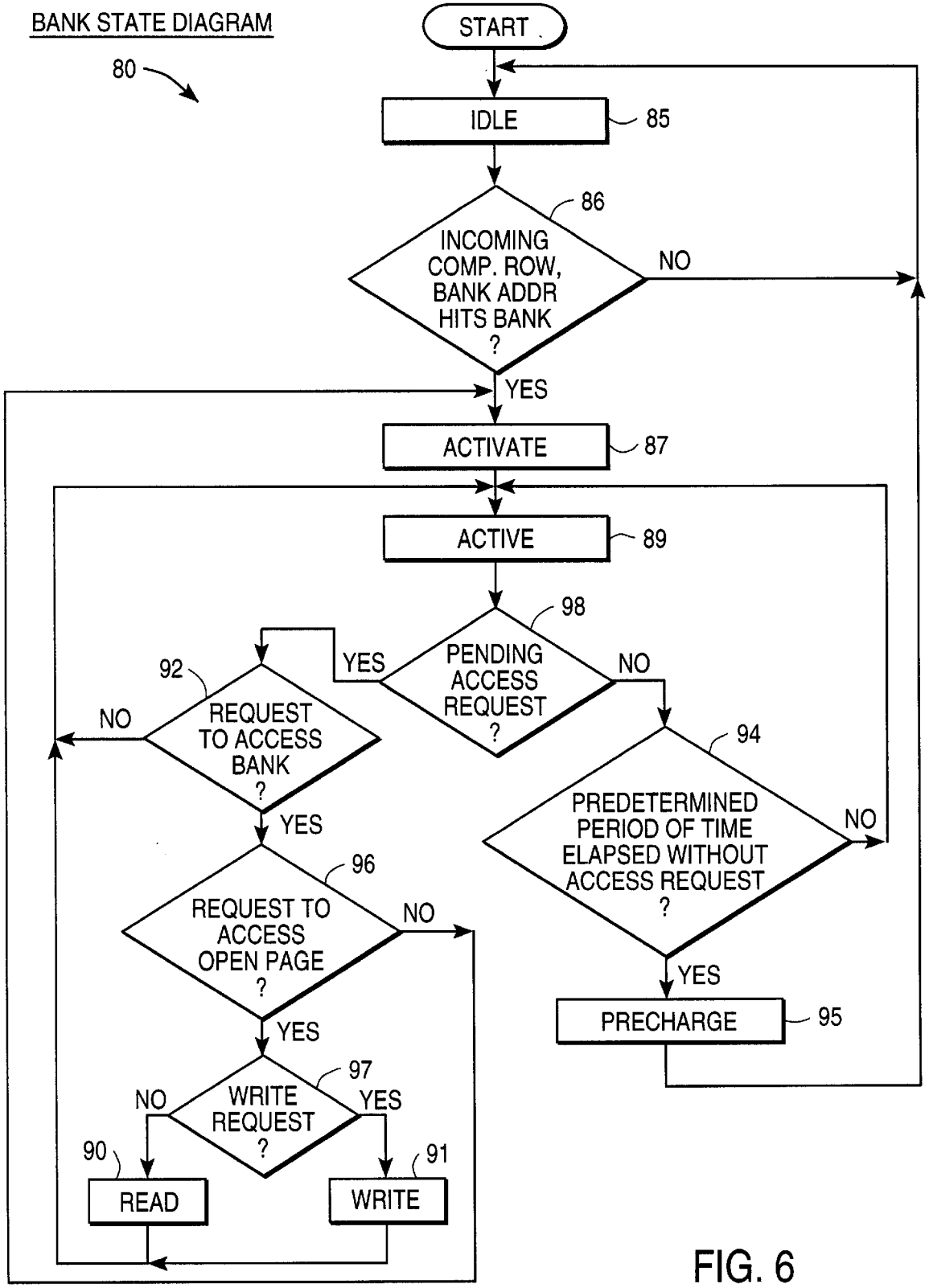
FIG. 6 is a state diagram implemented in one embodiment of a state machine for controlling the state of a bank of memory.

FIG. 6 is a state diagram 80 implemented in one embodiment of a state machine for controlling the state of a bank of memory. In one implementation, the state management logic (e.g., element 44 of FIG. 3) maintains separate and independent state machines for each bank of memory in the memory subsystem. This state information is then forwarded to the signal generator and the power down logic (e.g., via the DRAM control signal 68 and the bank state path 65, respectively, of FIG. 3). In an alternate embodiment, the state management logic could maintain, at least for the power down logic, a state machine that represents the collective state of all banks of memory within a given row (e.g., state1=all banks idle, or state2=one or more banks non-idle).

According to one embodiment, a bank of memory is initially in the idle state 85. At decision block 86, the component row selector and bank address received in the state management logic are examined to determine whether they indicate a request to access the bank. If so, then the bank is transitioned to the activate state 87. As discussed above, one or more signals indicating that the bank is in the activate state are forwarded to the signal generator (e.g., element 46 of FIG. 3) along with address information (e.g., FIG. 3, component row 59, row address 60, column address 62 and bank address 61). In response, the signal generator outputs the appropriate combination of chip select, row address strobe, column address strobe and write enable signals to initiate an activate operation in the DRAM components of the selected row. During the activate operation, the contents of a row of memory cells are transferred from the selected bank to the page buffer for the bank. As discussed above, this operation opens a page of memory for read and write access.

After the selected page has been opened, the bank is transitioned to the active state 89. If a pending access request is detected at decision block 98, then the request is evaluated at decision block 92 to determine whether it is a request to access the bank. If the request is not a request to access the bank (i.e., it is a request to access another bank and will be handled by the state machine maintained for that bank), the bank remains in the active state 89. If the request is a request to access the bank, then the request is further evaluated at decision block 96 to determine whether it is a request to access the open page or a different page within the bank. If the request is a request to access a different page within the bank, the bank is transitioned to a precharge state 93 to write the contents of the page buffer back to the appropriate row of memory cells within the bank. The signal generator is informed that the bank is to be transitioned to the precharge state 93 (e.g., via the DRAM control signal 68 of FIG. 3) and asserts the combination of chip select, row address strobe, column address strobe and write enable signals necessary to initiate the precharge operation. After the precharge is completed, the bank is returned to the activate state 87 to transfer the contents of the newly indicated row of memory cells to the page buffer for the bank. After the activate operation, the bank is again transitioned to the active state 89.

Returning to decision block 96, if the request is a request to access the open page, then the request is further evaluated at decision block 97 to determine whether write or read access is requested. If write access is requested, then the bank is transitioned to the write state 91 and the signal generator issues the appropriate command to perform the requested write. If a write operation is not requested (i.e., a read operation is requested), then the bank is transitioned to the read state 90 and the signal generator issues a read command to perform the requested read. After the requested read or write is completed, the bank returns to the active state 89.

If, while the bank is in the active state 89, no access requests are detected within a predetermined time, this lack of activity is detected decision block 94 and the bank is transitioned to precharge state 95 to close the open page in a precharge operation. After the precharge is completed, the bank returns to the idle state 85. Herein, the idle state 85 is defined to be a state in which the page buffer for a bank of memory does not contain a valid page of memory and is not in the process of receiving a valid page of memory. As indicated above, each of the banks of memory within the system memory may be in different states at any given time. Thus, all of the banks of a row of SDRAM components may be idle or one or more of the banks may be idle while others are non-idle.

According to one embodiment, the determination of whether an access request is pending (decision block 98) and whether a predetermined time has elapsed without an access request (decision block 94) is made on a bank by bank basis, so that the state machine for each bank need only detect access requests that hit that bank. (In this embodiment, decision block 92 may be eliminated). In an alternate embodiment, the access request detected at decision block 98 (and used to control time-out at block 94) may include requests to access any bank within the same component row as the bank to which the state machine corresponds. In yet another embodiment, the access request detected at decision block 98 (and used to control time-out at block 94) may include requests to access any bank in the memory subsystem.

Figure 7:
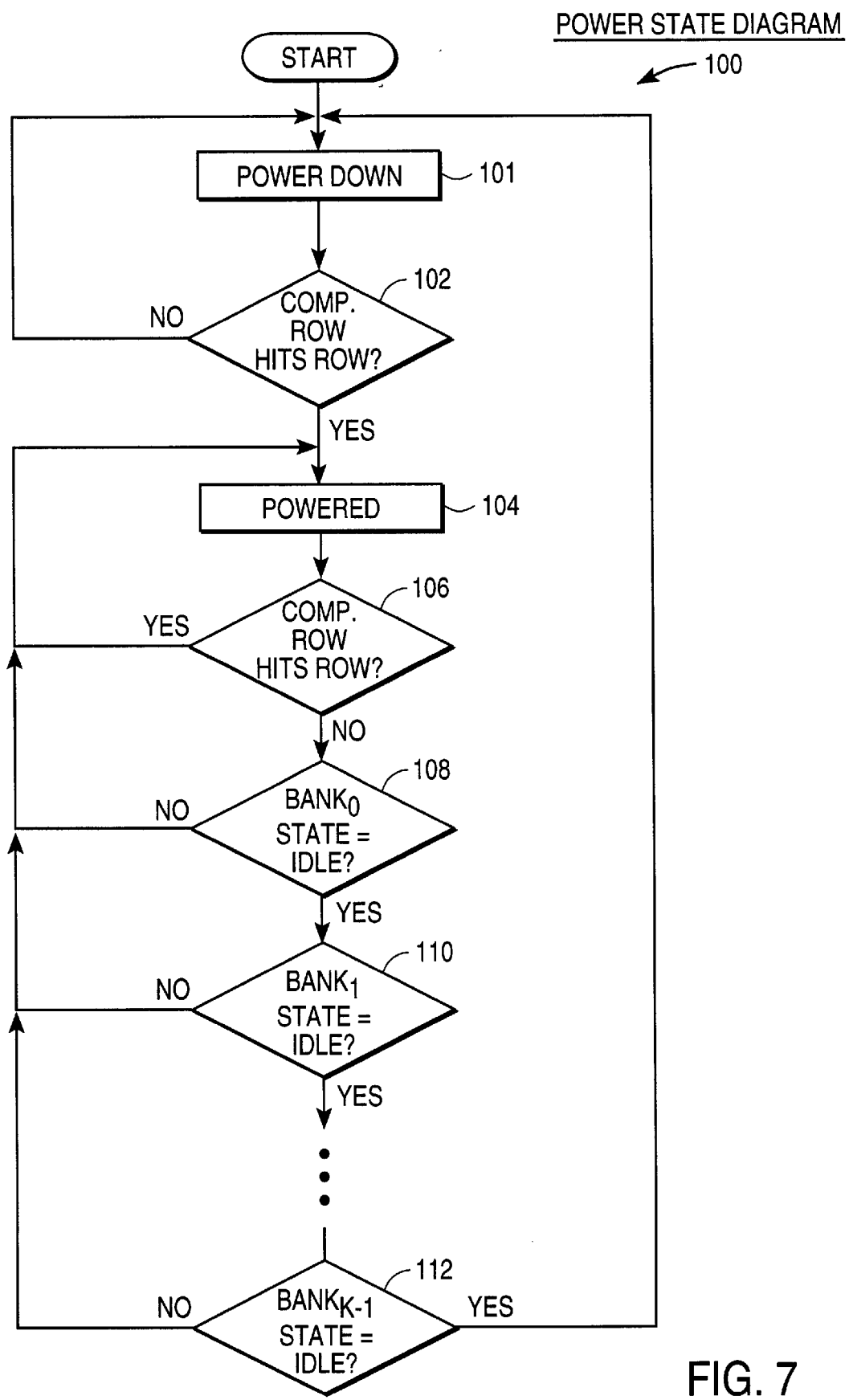
FIG. 7 is a state diagram implemented in one embodiment of a state machine for controlling the power consumption state of a row of SDRAM components.

FIG. 7 is a state diagram 100 implemented in one embodiment of a state machine for controlling the power consumption state of a row of SDRAM components. In one implementation, the power down logic (e.g., element 45 of FIG. 3) maintains a separate and independent state machine 100 for each row of SDRAM components in the memory subsystem. Assuming that a component row is initially in a power-down state 101, if a component row selector is received from the state management logic (e.g., element 44 of FIG. 3) that indicates that the component row is to be accessed (decision block 102), the power down logic transitions the component row to the powered state 104. This is accomplished by asserting the clock enable signal for the component row. Note that, in one embodiment, when the component row is in the power-down state 101, the component row ready signal (e.g., signal 66 of FIG. 3) is deasserted to indicate to the state management logic that the component row is not yet ready to be accessed. As discussed above, this information may be used by the state management logic to delay assertion of, for example, an activate command to the memory subsystem or a command acknowledge signal to the memory access logic.

According to one embodiment, while the component row is in the powered state 104, the power down logic examines the component row selector in step 106 to determine if the component row is to be accessed. If so, then the component row remains in the powered state 104. If the component row is not to be accessed, then the state of each bank in the component row is examined in decision blocks 108, 110 and 112 (note that there may be any number (K) of banks and therefore any number of bank state decision blocks). If any one of the banks in the component row is in a non-idle state (e.g., activate, active, read, write or precharge), then the component row is left in the powered state 104 and the power down logic continues to assert the clock enable signal to the component row. If, on the other hand, all of the banks of the component row are in an idle state, then the component row is transitioned to a power-down state 101 and the power down logic deasserts the clock enable signal to the component row. Because the power down logic maintains the state of each component row independently of the states of the other component rows, one or more of the component rows may be transitioned to the power-down state 101 while others remain in the powered state 104. In this way, rows of SDRAM components that are not in use may be selectively placed in the power-down state 101 to reduce power consumed by the memory subsystem.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:

means for receiving requests to access a memory that includes a plurality of rows of memory components; and means for placing one or more of the plurality of rows in a reduced power consumption state based on the requests while one or more other rows of the plurality of rows are accessed.

2. The apparatus of claim 1 wherein the means for placing one or more of the plurality of rows in a reduced power consumption state includes:

means for determining for a first row of the plurality of rows whether each bank of a plurality of banks included in the first row is in an idle state; and means for placing the first row in a reduced power consumption state if each bank of the plurality of banks is in an idle state.

3. The apparatus of claim 2 wherein the means for determining whether each bank of a plurality of banks included in the first row is in an idle state includes means for determining for a first bank of the plurality of banks whether a predetermined period of time has elapsed since the first bank has been accessed.

4. The apparatus of claim 2 wherein the means for determining whether each bank of a plurality of banks included in the first row is in an idle state includes means for determining whether a predetermined period of time has elapsed since the memory has been accessed.

5. An apparatus comprising:

memory access logic to receive requests to access a memory that includes a plurality of rows of memory components; and memory control logic to place one or more of the plurality of rows in a reduced power consumption state based on the requests while one or more other rows of the plurality of rows are accessed.

6. The apparatus of claim 4 wherein memory control logic includes:

state management logic to determine for a first row of the plurality of rows whether each bank of a plurality of banks included in the first row is in an idle state; and power down logic to place the first row in a reduced power consumption state if each bank of the plurality of banks is in an idle state.

7. The apparatus of claim 6 wherein the state management logic includes logic to determine for a first bank of the plurality of banks whether a predetermined period of time has elapsed since the first bank has been accessed.

8. The apparatus of claim 6 wherein the state management logic includes logic to determine whether a predetermined period of time has elapsed since the memory has been accessed.

9. A memory controller comprising:

state management logic to maintain a plurality of state values based on requests to access synchronous dynamic random access memory (SDRAM) components that are organized in rows; and power down logic to output clock enable signals, each clock enable signal being coupled to DRAM components in a respective one of the rows, and each clock enable signal being in either an active state or an inactive state based on a respective subset of the plurality of state values.

10. The memory controller of claim 9 wherein each subset of the plurality of state values includes a respective state value for each bank of a plurality of banks of memory included in DRAM components in a respective one of the rows.

11. The memory controller of claim 9 wherein the state management logic assigns the state value for each bank according to whether the bank is being accessed, the state value indicating that the bank is idle if the bank has not been accessed after a predetermined period of time has elapsed, and wherein, if each of the banks included within a respective row of the plurality of rows is indicated to be idle, the power down logic transitions the clock enable signal for the row from the active state to the inactive state.

12. The memory controller of claim 9 further comprising address decode logic to decode addresses supplied to the memory controller in response to the requests, the address decode logic decoding each address into at least one or more component row signals that identify one of the rows of SDRAM components and one or more bank address signals that identify a respective bank of storage cells in each of the SDRAM components included in the identified one of the rows of SDRAM components, and wherein the plurality of state values maintained by the state management logic includes one respective state value for each bank in each row, the state management logic assigning the respective state value for each bank in each row to indicate that the bank is in an idle state if the address decode logic has not decoded an address that identifies the bank within a predetermined period of time.

13. The apparatus of claim 9 wherein the power down logic outputs a signal to the state management logic to indicate whether a row of DRAM components identified by one of the requests is in a reduced power consumption state, the state management logic delaying access to the row if it is indicated by the signal from the power down logic to be in a reduced power-consumption state.

14. A computer system comprising:
   a processor;
   a memory including a plurality of rows of dynamic random access memory components;
   a graphics accelerator; and
   a memory controller coupled to the graphics accelerator, the processor and the memory, the memory controller including logic to place one or more of the rows of SDRAM components in a reduced power consumption state if the one or more rows of SDRAM components are not accessed within a predetermined period of time by memory accessing agents in the computer system that include the processor and the graphics accelerator.

15. A method comprising the steps of:
   receiving requests to access a memory that includes a plurality of rows of memory components; and
   placing one or more of the plurality of rows in a reduced power consumption state based on the requests while one or more other rows of the plurality of rows are accessed.

16. The method of claim 15 wherein the step of placing one or more of the plurality of rows in a reduced power consumption state includes the steps of:

determining for a first row of the plurality of rows whether each bank of a plurality of banks included in the first row is in an idle state; and placing the first row in a reduced power consumption state if each bank of the plurality of banks is in an idle state.

17. The method of claim 16 wherein the step of determining whether each bank of a plurality of banks included in the first row is in an idle state includes the step of determining for a first bank of the plurality of banks whether a predetermined period of time has elapsed since the first bank has been accessed.

18. The method of claim 16 wherein the step of determining whether each bank of a plurality of banks included in the first row is in an idle state includes the step of determining whether a predetermined period of time has elapsed since the memory has been accessed.

19. The method of claim 15 wherein the step of receiving requests to access a memory includes the step of receiving requests to access a memory that includes a plurality of synchronous dynamic random access memory (SDRAM) components.

20. The method of claim 15 wherein the step of placing one or more of the plurality of rows in a reduced power consumption state includes the step of deasserting a clock enable signal that is received at a clock enable input of each of a plurality of synchronous dynamic random access memory (SDRAM) components that are included in a first row of the plurality of rows.

21. The method of claim 20 further comprising the steps of:
   receiving a request to access data stored in the first row of the plurality of rows; and
   asserting the clock enable signal in response to the request to access data stored in the first row.

22. The method of claim 21 further comprising the step of delaying for a first time period after asserting the clock enable signal to provide time for the first row to transition out of the reduced-power consumption state before asserting an address strobe signal to the SDRAM components.

* * * * *